(12) United States Patent
Hanna et al.

(10) Patent No.: US 12,476,176 B2
(45) Date of Patent: Nov. 18, 2025

(54) GLASS CORE SUBSTRATE PRINTED CIRCUIT BOARD FOR WARPAGE REDUCTION

(71) Applicant: Intel Corporation, Santa Clara, CA (US)

(72) Inventors: Carlton Hanna, San Jose, CA (US); Georg Seidemann, Landshut (DE); Eduardo De Mesa, Munich (DE); Abdallah Bacha, Munich (DE); Lizabeth Keser, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 723 days.

(21) Appl. No.: 17/707,183

(22) Filed: Mar. 29, 2022

(65) Prior Publication Data

US 2023/0317582 A1     Oct. 5, 2023

(51) Int. Cl.
| | |
|---|---|
| H01L 23/498 | (2006.01) |
| H01L 21/48 | (2006.01) |
| H01L 23/14 | (2006.01) |
| H01L 23/48 | (2006.01) |
| H01L 25/065 | (2023.01) |
| H01L 23/00 | (2006.01) |
| H01L 23/538 | (2006.01) |

(52) U.S. Cl.
CPC .... *H01L 23/49822* (2013.01); *H01L 21/4857* (2013.01); *H01L 21/486* (2013.01); *H01L 23/145* (2013.01); *H01L 23/481* (2013.01); *H01L 23/49816* (2013.01); *H01L 23/49838* (2013.01); *H01L 25/0655* (2013.01); *H01L 23/5381* (2013.01); *H01L 23/5383* (2013.01); *H01L 23/5386* (2013.01); *H01L 24/16* (2013.01); *H01L 2224/16227* (2013.01); *H01L 2224/16237* (2013.01); *H01L 2924/3511* (2013.01)

(58) Field of Classification Search
CPC .......... H01L 23/49822; H01L 21/4857; H01L 21/486; H01L 23/5383; H01L 23/15; H01L 23/538
See application file for complete search history.

(56) References Cited

U.S. PATENT DOCUMENTS

| | | | |
|---|---|---|---|
| 2015/0221571 A1* | 8/2015 | Chaparala | H01L 24/81 174/255 |
| 2019/0341320 A1* | 11/2019 | Pollard | H01L 21/561 |
| 2021/0050306 A1* | 2/2021 | Link | H01L 23/49816 |

* cited by examiner

*Primary Examiner* — Evan G Clinton
(74) *Attorney, Agent, or Firm* — Essential Patents Group, LLP

(57) ABSTRACT

An electronic device comprises a first redistribution layer (RDL) including multiple sublayers of conductive traces formed in an organic material; a stiffening layer including one of a ceramic or glass, the stiffening layer including a first surface contacting a first surface of the first RDL and including a through layer via (TLV); and multiple integrated circuits (ICs) arranged on a second surface of the first RDL and including bonding pads, wherein the conductive traces of the first RDL provide electrical continuity between at least one bonding pad of the ICs and at least one TLV of the stiffening layer.

25 Claims, 14 Drawing Sheets

GLASS CORE SUBSTRATE PRINTED CIRCUIT BOARD FOR WARPAGE REDUCTION

TECHNICAL FIELD

Embodiments pertain to packaging of integrated circuits (ICs). Some embodiments relate to a package substrate having a stiffening layer mode of ceramic or glass.

BACKGROUND

Electronic systems often include integrated circuits (ICs) that are interconnected and packaged as a subassembly. It is desired to integrate multiple types of IC dies into a single package to create an efficient system in a package. However, as packaged electronic systems become larger due to adding more IC dies, the area form factor (e.g., X-Y dimensions) of the packages becomes larger. If the area form factor of a package becomes too large, the package can be susceptible to warping. Thus, there are general needs for devices, systems and methods that address the size challenges for interconnection and packaging of electronic systems.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

To meet the demand for increased functional complexity in smaller devices, manufacturers integrate multiple types of integrated circuits (ICs) dies in a single electronic package to create an efficient electronic system in a package. For example, chiplets are a technique for integrating various processing functionality. Generally, a chiplet system is made up of discrete chips (e.g., ICs on different substrates or dies) that are packaged together. This arrangement is distinct from single chips that contain distinct device blocks on one substrate (e.g., single die), such as a system-on-a-chip (SoC), or discretely packaged devices integrated on a board. In general, chiplets provide better performance (e.g., lower power consumption, reduced latency, etc.) than discretely packaged devices, and chiplets provide greater production benefits than single die chips. These production benefits can include higher yields or reduced development costs and time.

To realize a chiplet-based system the individual chiplet dies can be connected using connection dies known as bridges. Bridges serve as an in-package interconnect for multiple die packages that transmit large amounts of data. As the number of chiplets in a system increases, it is desired to use interconnect routing having a very fine pitch to keep the system dimensions small.

Figure 1:
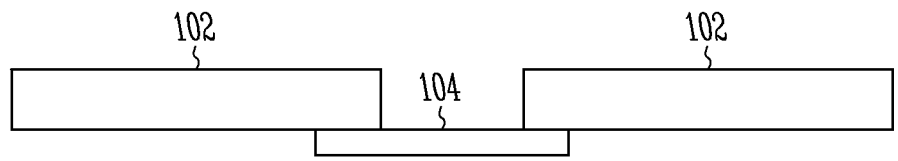
FIG. 1 is an illustration of a portion of an electronic assembly that includes two silicon dies and a redistribution layer that is an organic bridge in accordance with some embodiments.

FIG. 1 is an illustration of a portion of an electronic assembly that includes two silicon (Si) dies 102 and a redistribution layer (RDL) that is an organic bridge 104. Organic bridges can be RDLs formed out of an organic material. Organic bridges currently have a wider pitch than desired (e.g., around 1.5 microns). Also, organic bridges are susceptible to warpage, especially when exposed to higher temperatures that may be present when the systems are assembled.

Figure 2:
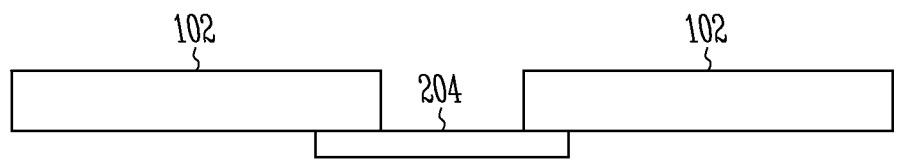
FIG. 2 is an illustration of a portion of another electronic assembly that includes two silicon dies and a redistribution layer that is a silicon bridge in accordance with some embodiments.

FIG. 2 is an illustration of a portion of an electronic assembly that includes two silicon dies 102 and a silicon bridge 204 that can include an RDL. Silicon bridges can be formed from a silicon wafer for example. However, silicon bridges are relatively expensive and may have a longer process flow than desired.

Figure 3:
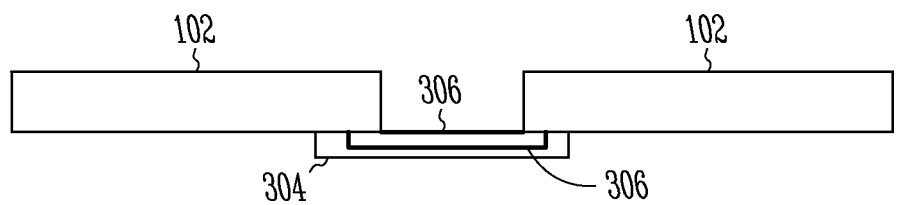
FIG. 3 is an illustration of a portion of another electronic assembly that includes two silicon dies and a redistribution layer that is a glass bridge in accordance with some embodiments.

FIG. 3 is an illustration of a portion of an electronic assembly that includes two silicon (Si) dies 102 and a glass bridge 304. The glass bridge 304 can include bonding pads and through glass vias (TGVs) to route signals from the silicon die 102 through the glass bridge. The glass bridge 304 can be a glass RDL that has electrically conductive traces 306 (e.g., metal traces) to route signals between the silicon dies. The glass bridge 304 can be connected to more than two silicon dies and include conductive traces to route signals among the several silicon dies.

The glass bridge 304 may include one or both of surface interconnect and buried interconnect. The conductive traces 306 may be located on the surface of the glass bridge 304, in one or more buried layers of the glass bridge 304, or both the surface and one or more buried layers of the glass bridge 304. Multiple glass layers can be built up (e.g., bonded together) into the glass bridge 304. The conductive traces can be added to individual layers to form buried interconnect in the glass bridge 304. Using multiple glass layers also allows for tuning regarding the coefficient of thermal expansion (CTE) of the glass bridge 304 to reduce warpage.

Figure 4:
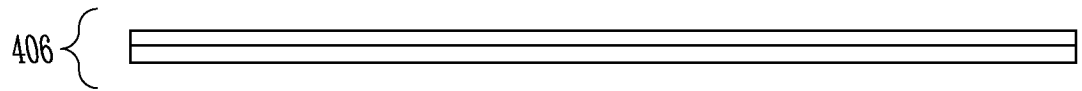
FIG. 4 is an illustration of an example of a multi-layer glass bridge in accordance with some embodiments.

FIG. 4 is an illustration of an example of a two-layer glass bridge. The glass layers have different CTEs and may have different thicknesses. The top layer may have a CTE and thickness that results in positive warpage. The bottom layer may have a CTE and thickness that results in negative warpage opposite the top layer. The difference in warpage direction causes the combination of layers to better resist an overall warpage than each single layer alone. The CTEs of the layers can be reversed, with the top layer having a negative warpage and the bottom layer having a positive warpage.

The two glass layers of the glass bridge in FIG. 4 can have different thickness, warpages and CTEs. Multilayer bridges can be realized be bonding multiple single layer bridges or multiple double layer bridges. The multi-layer glass bridges may have conductive traces that run horizontally between glass layers and TGVs that extend from a surface of the glass bridge to one or more conductive traces for routing between silicon dies. The multi-layer glass bridges may have glass vias that extend between layers of conductive traces and do not extend to the surface. The glass vias can be formed in a glass layer before it is bonded to another glass layer.

The trend to package multiple IC dies like chiplets into one electronic system can lead to needing large package sizes to fit all the dies. The current package technologies for electronic packaging are limited in the area form factor (e.g., X-Y dimension) that can be achieved due to warping.

The susceptibility to warping limits the number of IC dies that can be included in multi-dies assemblies and limits the size of an electronic package. Package warpage is the deviation from flatness caused by internal stress of the electronic package. Warpage can lead to different solder joint geometries between the center and the edge of the interposer area, which can reduce the reliability. In addition, warpage can lead to solder balls bridging and interconnect opens or shorts between the solder balls which reduces the assembly yield.

A package stiffener can be used to make the electronic package less susceptible to warping, but package stiffeners are typically limited to the periphery or edges of the electronic package and only reduce the susceptibility of the package edges to warping. An ultra-thin core (UTC) package can reduce susceptibility to warping but the thickness (Z-dimension) of the package increases with the increase in form factor (X-Y dimensions) of the electronic package. To meet the demand for increased functional complexity in smaller devices, semiconductor substrate packaging can include stiffening layers. The stiffening layers can be made of ceramic or glass. In some aspects, the stiffening layer is a multi-layer stack including at least one glass layer and at least one ceramic layer.

Figure 5:
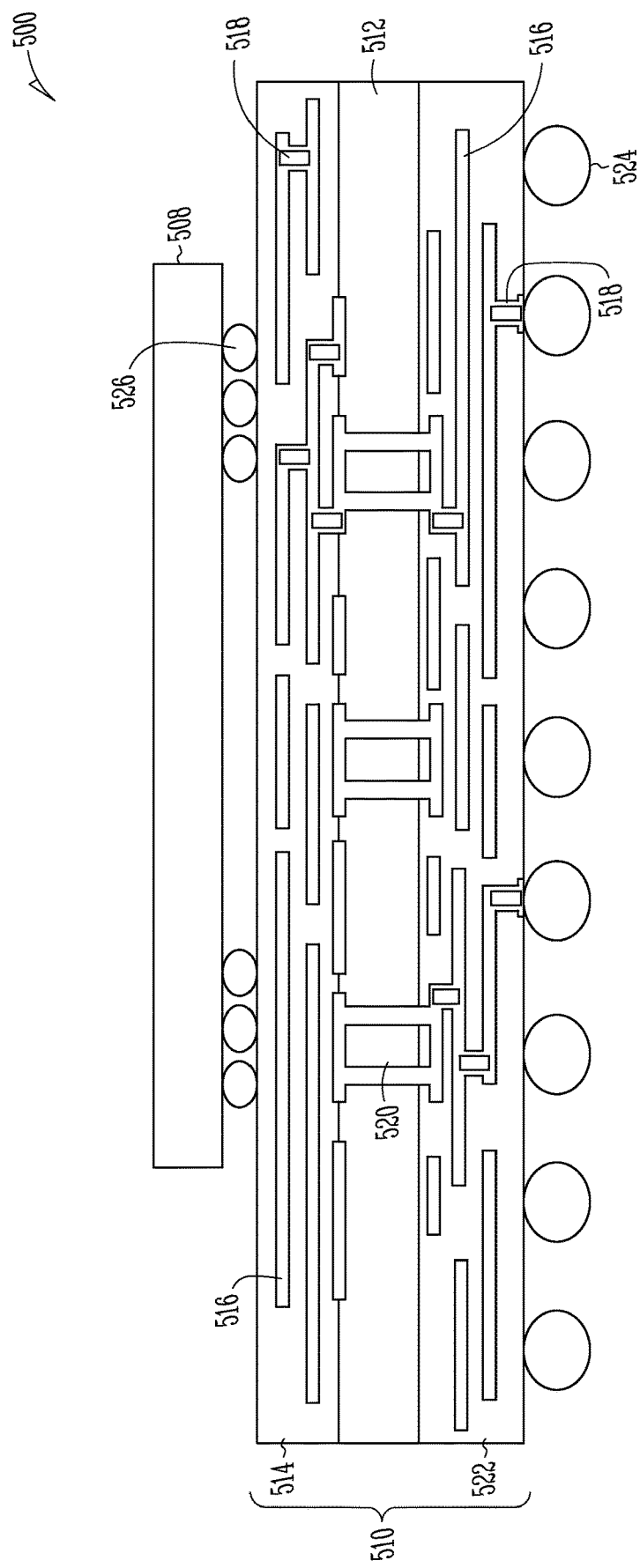
FIG. 5 is an illustration of an example of portions of an electronic device having a substrate that includes a stiffening ceramic core layer in accordance with some embodiments.

FIG. 5 is an illustration of an example of portions of an electronic device with improved robustness with regard to package warping. The electronic device 500 includes a System on Chip (SoC) device 508 attached to a substrate 510. The substrate 510 includes a stiffening layer that is a core layer 512. The stiffening core layer 512 is made of a ceramic (e.g., aluminum oxide or silicon oxide). Because the core layer 512 is ceramic, the core layer 512 is a warpage compensation layer within the substrate 510 that reduces the susceptibility of the entire electronic package to warping compared to a substrate made only with an organic material such as FR4.

The substrate 510 includes a first RDL attached to the top surface of the core layer 512. The RDL 514 includes multiple sublayers of electrically conductive traces 516 (e.g., metal traces) formed in a dielectric that is an organic material. The RDL 514 includes micro vias 518 that are connected to the conductive traces 516. The micro vias 518 provide electrical continuity between conductive traces on different sublayers of the RDL 514.

The ceramic core layer 512 includes through layer vias (TLVs) (e.g., through ceramic vias, or TCVs). In some examples, the TLVs 520 include plated through holes (PTHs). The PTHs may have having a sidewall plating that includes metal (e.g., one or more of titanium and copper).

The electronic device 500 shows one SoC device 508 attached to the top surface of the first RDL 514 for simplicity of the diagram, but there may be many ICs (e.g., chiplets) or multiple SoCs arranged on the top surface of the RDL 514 and the substrate 512 may have a large X-Y dimension. The SoC 508 includes bonding pads and solder bumps 526, and the top surface of the first RDL also induces bonding pads to connect to the solder bumps 526. Features on the top surface of the first RDL may have a finer pitch than features on the bottom surface of the second RDL. The conductive traces 516 of the first RDL provide electrical continuity between the bonding pads of the SoC 508 and the TLVs 520 of the core layer 512, the TLVs 520 provide electrical continuity between the conductive traces 516 of the first RDL and the second RDL, and the conductive traces 516 of the second RDL 522 provide electrical continuity between the TLVs 520 and the solder bumps 524. The solder bumps 524 may be used to connect the electronic device 500 to a higher level assembly (e.g., a motherboard).

The ceramic core layer 512 can compensate for the warpage of the remaining layers of substrate stack and reduce warpage of the substrate 512 and warpage of the device package during soldering. The CTEs of the RDLs and the ceramic can be selected to facilitate reduced warpage during a specific process.

In some examples, the substrate 510 can include a second core layer (not shown) if desired. The second core layer can be attached to the bottom surface of the second RDL 522. A third RDL can be attached to the second core layer and be the bottom layer that includes the bonding pads for the solder bumps 524. In some examples, the second core layer can be the bottom layer that includes the bonding pads.

FIGS. 6A-6F illustrate portions of an example of a process flow of forming a substrate having a stiffening ceramic core layer. The process 600 may be used in forming the substrate 510 of FIG. 5.

Figure 6A:
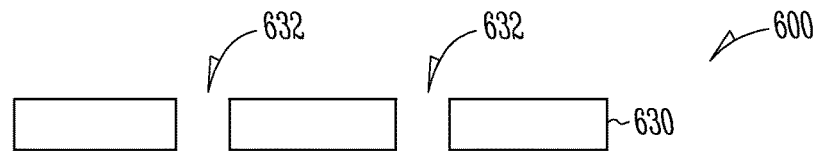
FIGS. 6A-6F illustrate portions of an example of a process flow of forming a substrate having a stiffening ceramic core layer in accordance with some embodiments.
Figure 6B:
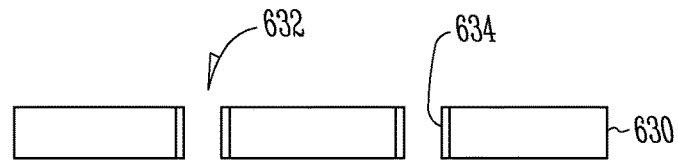
Figure 6C:
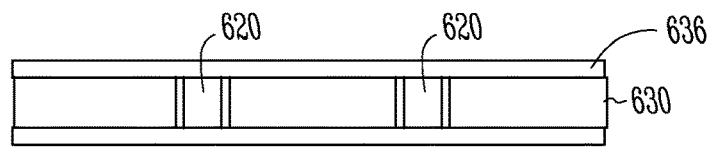

In FIG. 6A, a ceramic 630 (e.g., alumina or silica) is drilled (e.g., by laser drilling) to form openings 632 for what will be the TLVs. The ceramic 630 may be mounted on a production carrier (not shown) when the drilling is performed, and the production carrier is later removed. In FIG. 6B, the openings 632 are plated with a metal 634 (e.g., copper). In FIG. 6C shows forming the dielectric 636. The dielectric is formed in the openings 632 to form PTHs as TLVs 620. Dielectric layers are formed on the top and bottom surfaces of the ceramic layer 630.

Figure 6D:
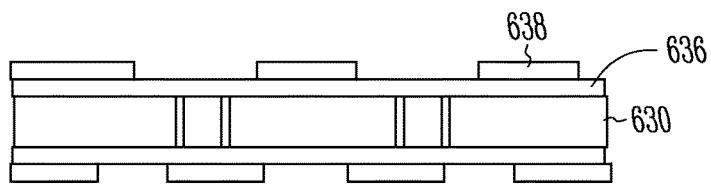
Figure 6E:
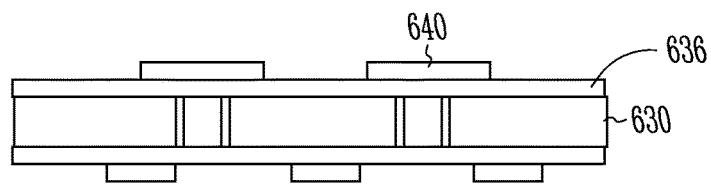
Figure 6F:
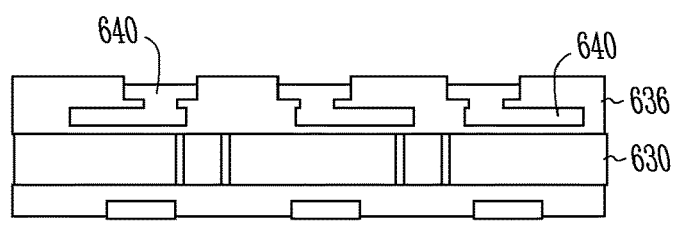

In FIG. 6D, photo resist 638 is patterned on the dielectric layers using photolithography. A seed layer is deposited on the area exposed by the photo resist. In some examples, a seed layer is sputtered onto a dielectric layer before the photo resist. In FIG. 6E, the resist is removed after metal plating, and seed etching is used to pattern the metal to form conductive traces 640. In FIG. 6F, the layer including the conductive traces 640 is filled in with dielectric and additional layers of metal and dielectric are built up on the ceramic 630 to form a substrate with a ceramic core. Steps of the process can be repeated to create the RDLs and ceramic layers desired in the substrate. The process flow 600 may continue with the generation of built-up layers according to a standard printed circuit board (PCB) process. Multiple ICs may be arranged on the top surface of the substrate. Bonding pads and solder bumps may be attached to the bottom surface of the substrate.

Figure 7:
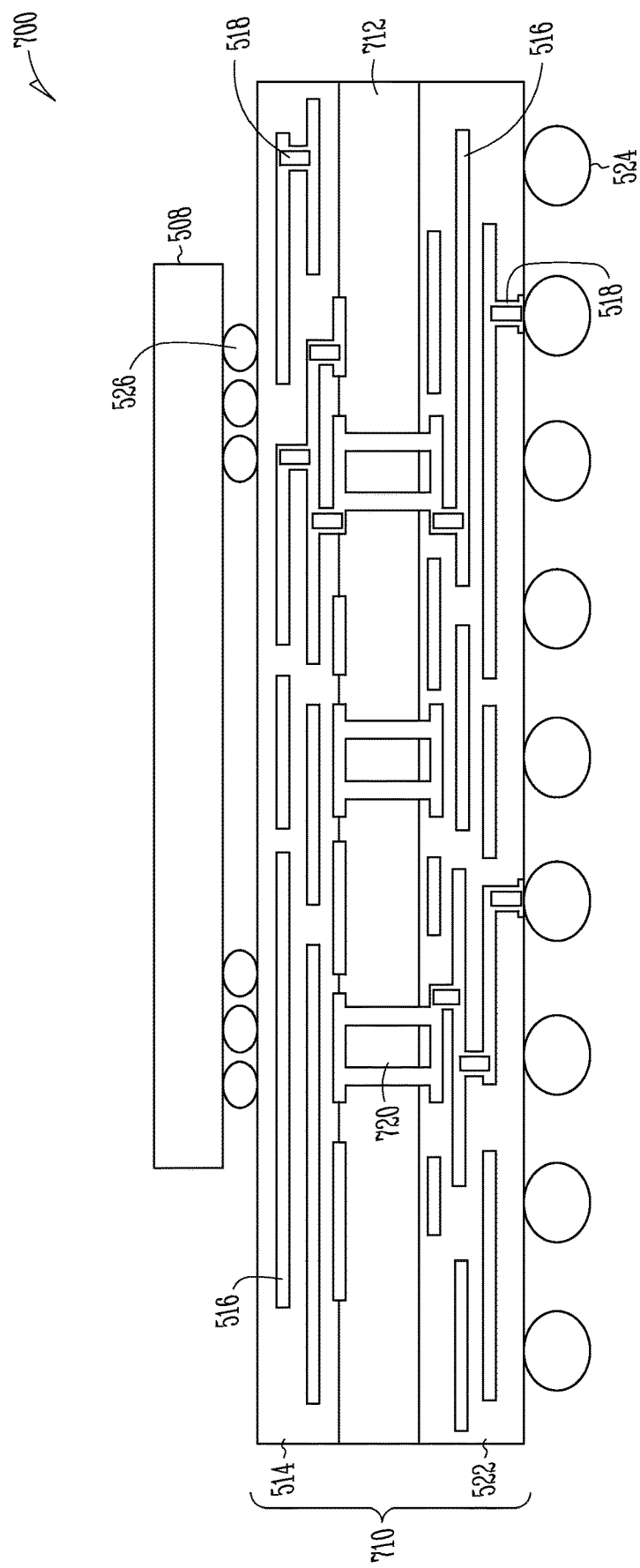
FIG. 7 is an illustration of an example of portions of an electronic device having a substrate that includes a stiffening glass core layer in accordance with some embodiments.

FIG. 7 is an illustration of another example of portions of an electronic device with improved robustness with regard to package warping. As in the example of FIG. 5, the electronic device 700 of FIG. 7 includes an SoC device 508 attached to a substrate 710 and the substrate 710 includes a stiffening core layer 712. The difference is that in the example of FIG. 7, the stiffening core layer 712 is made of glass (e.g., silicate glass).

In addition to the advantage of reducing warpage of the substrate and improving coplanarity as compared to an organic core, the glass core 712 enables transmission of high frequency signals within the package. This is particularly useful in a chiplet system that includes central processing unit (CPU) chiplets and high-bandwidth memory chiplets in a disaggregated CPU architecture. Glass also has lower thermal conductivity than silicon and a glass core may provide a layer of thermal insulation.

The substrate 710 includes a first RDL 514 attached to the top surface of the glass core layer 712 and a second RDL 522 on the bottom surface of the glass core 712. The glass core layer 712 includes TLVs 720 (e.g., through glass vias, or TGVs) or PTHs. The conductive traces 516 of the first RDL 514 provide electrical continuity between the bonding pads of the SoC 508 and the TLVs 720 of the glass core layer 712, the TLVs 720 provide electrical continuity between the conductive traces 516 of the first RDL 514 and the second RDL 522, and the conductive traces 516 of the second RDL 522 provide electrical continuity between the TLVs 520 and the solder bumps 524.

The glass core layer 712 may be comprised of multiple layers of non-identical glass. The glass core layer may have two glass layers as in the example of FIG. 4. The two glass layers may differ in one or more of thickness, warpage, and CTE. The glass core layer 712 may be a multilayer glass core having multiple single glass layers bonded together or multiple double glass layers bonded together. The multilayer glass core may be a glass RDL and may have conductive traces that run horizontally between glass layers and TGVs that extend from a surface of the glass core to one or more conductive traces for routing. The multi-layer glass core may have TGVs that extend between layers of conductive traces and do not extend to the surface. The TGVs can be formed in a glass layer before it is bonded to another glass layer, or the TGVs may be formed in the composite glass layer after the multiple layers are bonded together.

FIGS. 8A-8F illustrate portions of an example of a process flow of forming a substrate having a stiffening glass core layer. The process 800 may be used in forming the substrate 710 of FIG. 7.

Figure 8A:
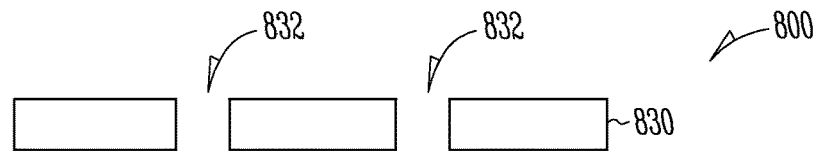
FIGS. 8A-8F illustrate portions of an example of a process flow of forming a substrate having a stiffening glass core layer in accordance with some embodiments.
Figure 8B:
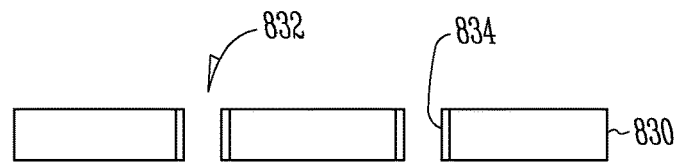
Figure 8C:
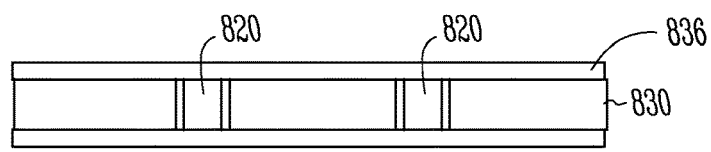

In FIG. 8A, a stiffening glass layer 830 is drilled (e.g., using laser drilling) to form openings 832 for what will be the TGVs. The glass layer 830 may be a uniform glass layer or may be made of multiple layers of glass bonded together. The glass layer 830 may be mounted on a production carrier (not shown) when the drilling is performed, and the production carrier is later removed. In FIG. 8B, the openings 832 are plated with a metal 834 (e.g., copper). In FIG. 8C shows forming the dielectric 836. The dielectric is formed in the openings 832 to form TGVs 820. Dielectric layers are formed on the top and bottom surfaces of the glass layer 830.

Figure 8D:
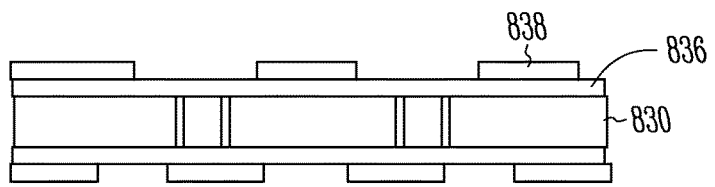
Figure 8E:
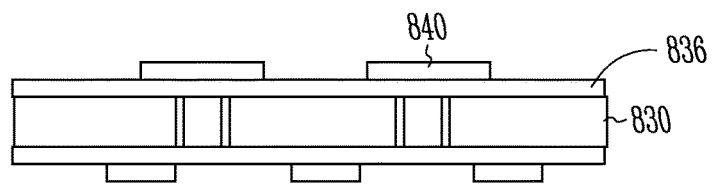
Figure 8F:
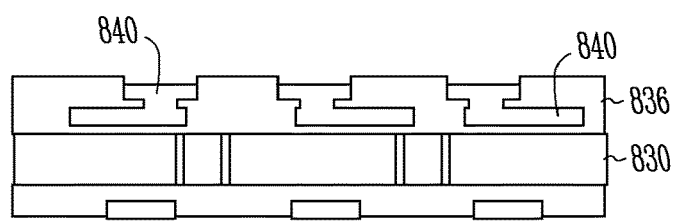

In FIG. 8D, photo resist 838 is patterned on the dielectric layers using photolithography. A metal seeding is deposited on the area exposed by the photo resist. In FIG. 8E, the resist is removed after metal plating, and seed etching is used to pattern the metal to form conductive traces 840. In FIG. 8F, the metal layer including the conductive traces 840 is filled in with dielectric and additional layers of metal and dielectric are built up on the glass layer 830 to form a substrate with a glass core. Steps of the process can be repeated to create additional RDLs and glass layers of the substrate as desired. Multiple ICs may be arranged on the top surface of the substrate. Bonding pads and solder bumps may be attached to the bottom surface of the substrate.

Figure 9:
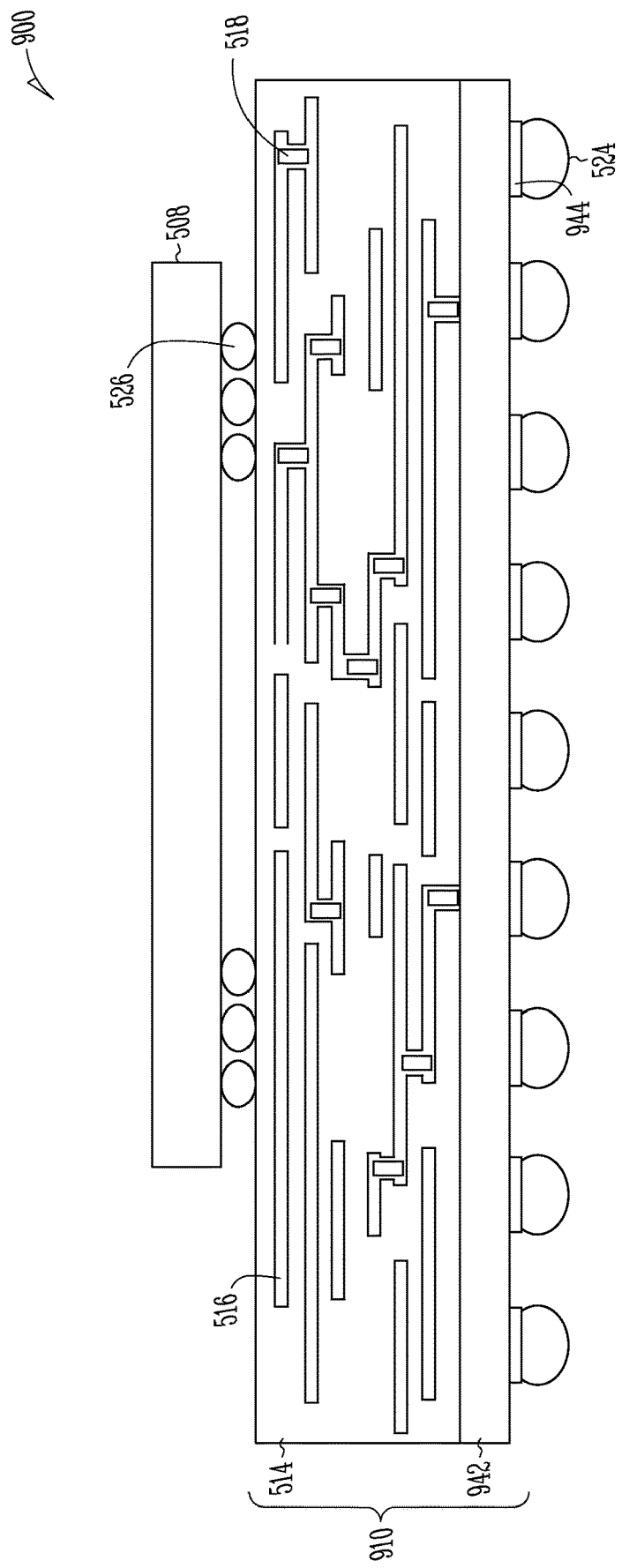
FIG. 9 is an illustration of an example of portions of an electronic device having a substrate that includes a stiffening ceramic carrier layer in accordance with some embodiments.

FIG. 9 is an illustration of an example of portions of an electronic device with improved robustness with regard to package warping. The electronic device 900 includes an SoC device 508 attached to a substrate 910. The substrate 910 includes a stiffening layer that is a ceramic carrier layer 942. Only one SoC device 508 is shown for simplicity of the diagram, and the electronic device 900 may include several ICs on the top surface of the substrate 910. Because the carrier layer 942 is made of a ceramic, the ceramic carrier layer 942 is a warpage compensation layer at a surface (e.g., bottom surface) of the substrate 910 that reduces the susceptibility of the entire electronic package to warping compared to a substrate made only with an organic material.

The substrate 910 includes an RDL 514 attached to the top surface of the ceramic carrier layer 942, and the SoC device 508 is attached to the top surface of the RDL 514. The RDL 514 includes electrically conductive interconnect that includes multiple sublayers of electrically conductive traces 516 and multiple micro vias 518 formed in an organic material. The bottom surface of the ceramic carrier layer 942 may be the bottom surface of the substrate 910. The bottom surface of the ceramic carrier layer 942 includes bonding pads 944 to which solder bumps 524 can be attached. The ceramic carrier layer 942 includes TLVs (not shown) to provide electrical continuity between the electrically conductive interconnect of the RDL 514 and the bonding pads 944. I There may be a thin interconnect layer (not shown) between the ceramic carrier layer 942 and bonding pads 944 to provide electrical continuity between the TLVs and the bonding pads 944. The RDL 514 provides electrical continuity between bonding pads of the SoC device 508 to the TLVs, and the TLVs provide electrical continuity from the RDL 514 to the bonding pads 944.

FIGS. 10A-10K illustrate portions of an example of a process flow of forming a substrate having a stiffening ceramic carrier layer 942. The process 1000 may be used in forming the substrate 910 of FIG. 9.

Figure 10A:
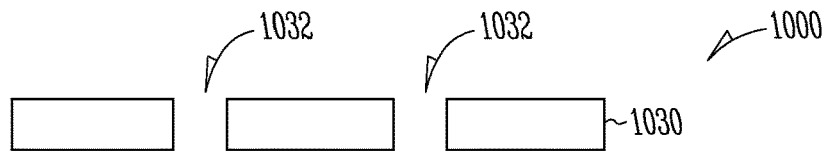
FIGS. 10A-10K illustrate portions of an example of a process flow of forming a substrate having a stiffening ceramic carrier layer in accordance with some embodiments.
Figure 10B:
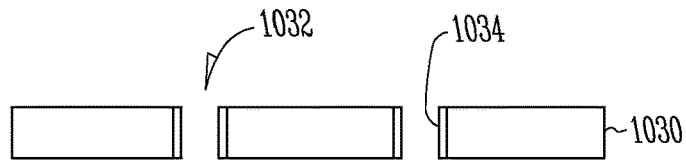
Figure 10C:
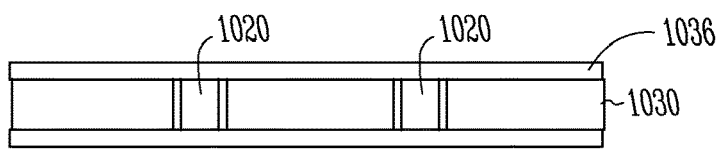

In FIG. 10A, a stiffening ceramic carrier layer 1030 is drilled (e.g., using laser drilling) to form openings 1032 for TLVs. In FIG. 10B, the openings 1032 are plated with metal 1034. An RDL is formed to contact the top surface of the ceramic carrier layer 1030. Layers of the RDL are built up using a dielectric and metal. In FIG. 10C, dielectric is formed in the openings 1032 to form TLVs 1020. Dielectric layers are formed on the top and bottom surfaces of the ceramic carrier layer 1030.

Figure 10D:
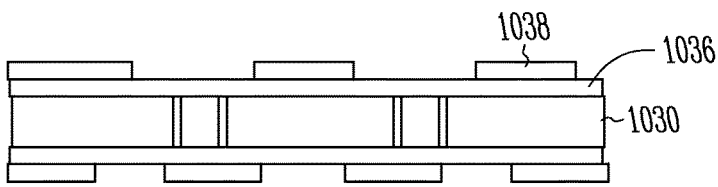
Figure 10E:
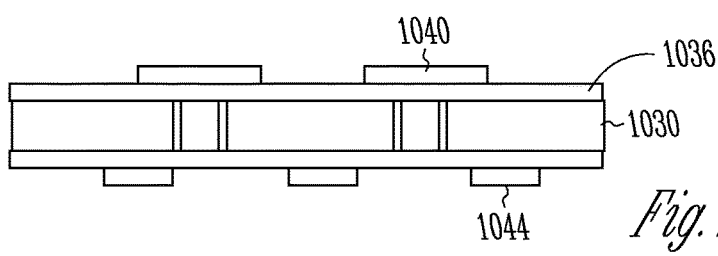
Figure 10F:
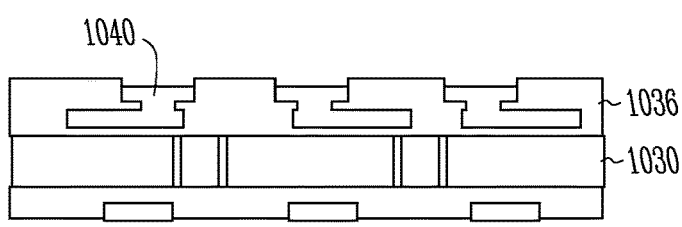

In FIG. 10D, photo resist 1038 is patterned on the dielectric layers using photolithography. A seed layer is deposited on the area exposed by the photo resist. In FIG. 10E, the resist 1038 is removed after metal plating, and seed etching is used to pattern the metal to form conductive traces 1040 and bonding pads 1044. In FIG. 10F, the metal layer including the conductive traces 1040 is filled in with dielectric and additional layers of metal and dielectric are built up on the ceramic carrier layer 1030. A thin dielectric layer 1045 having conductive traces may be formed between the ceramic carrier layer 1030 and bonding pads 1044 to provide electrical continuity between the TLVs and the bonding pads 1044.

Figure 10G:
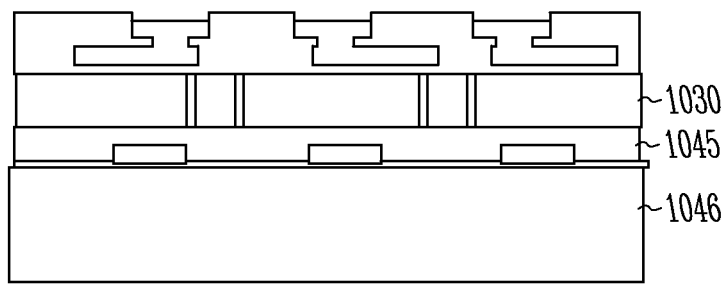
Figure 10H:
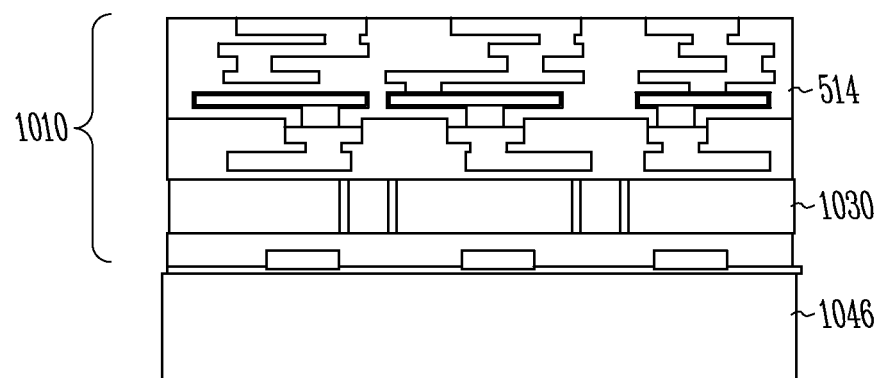
Figure 10I:
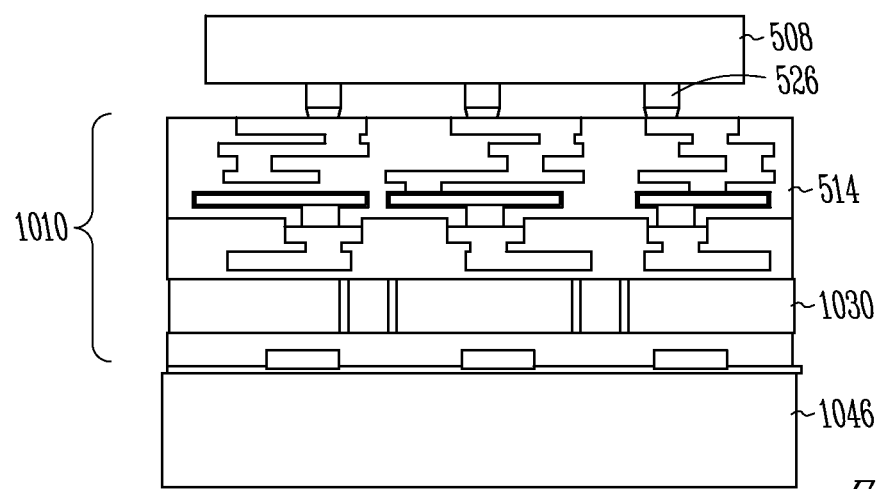
Figure 10J:
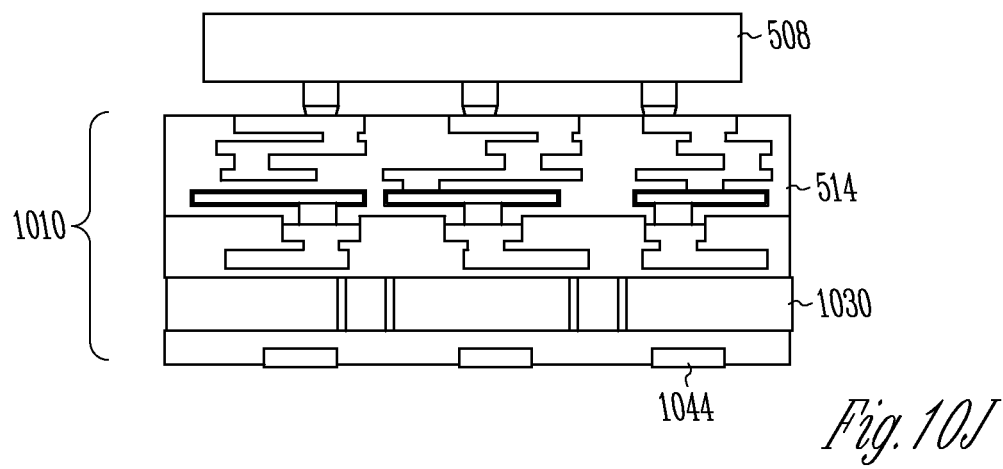
Figure 10K:
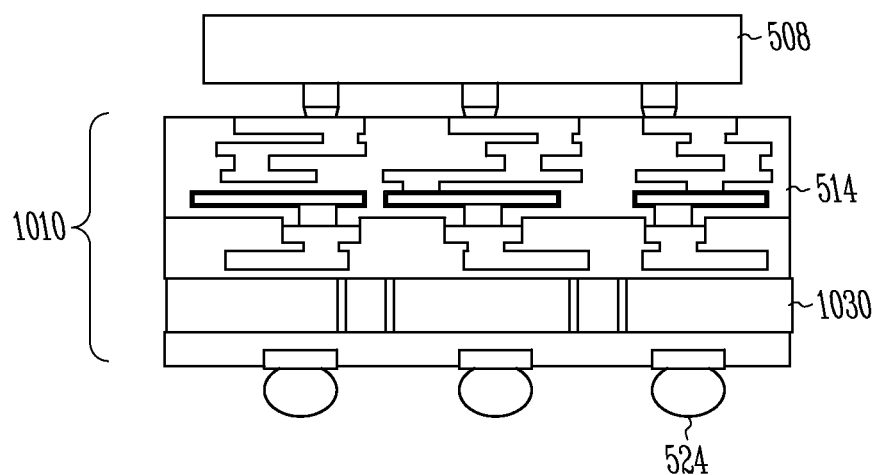

In FIG. 10G, the ceramic carrier layer 1030 is optionally bonded to a production carrier 1046. The production carrier 1046 is sacrificial and will later be removed. In FIG. 10H, a multi-layer RDL 514 is built-up to form a substrate 1010 with a stiffening ceramic carrier layer 1030. In FIG. 10I, a SoC device 508 is attached to the top surface of the substrate 1010. In FIG. 10J, the substrate 1010 is released from the production carrier layer 1046. In FIG. 10K, solder bumps 524 are added to the bonding pads 1044 exposed by removal of the sacrificial production carrier 1046.

Figure 11:
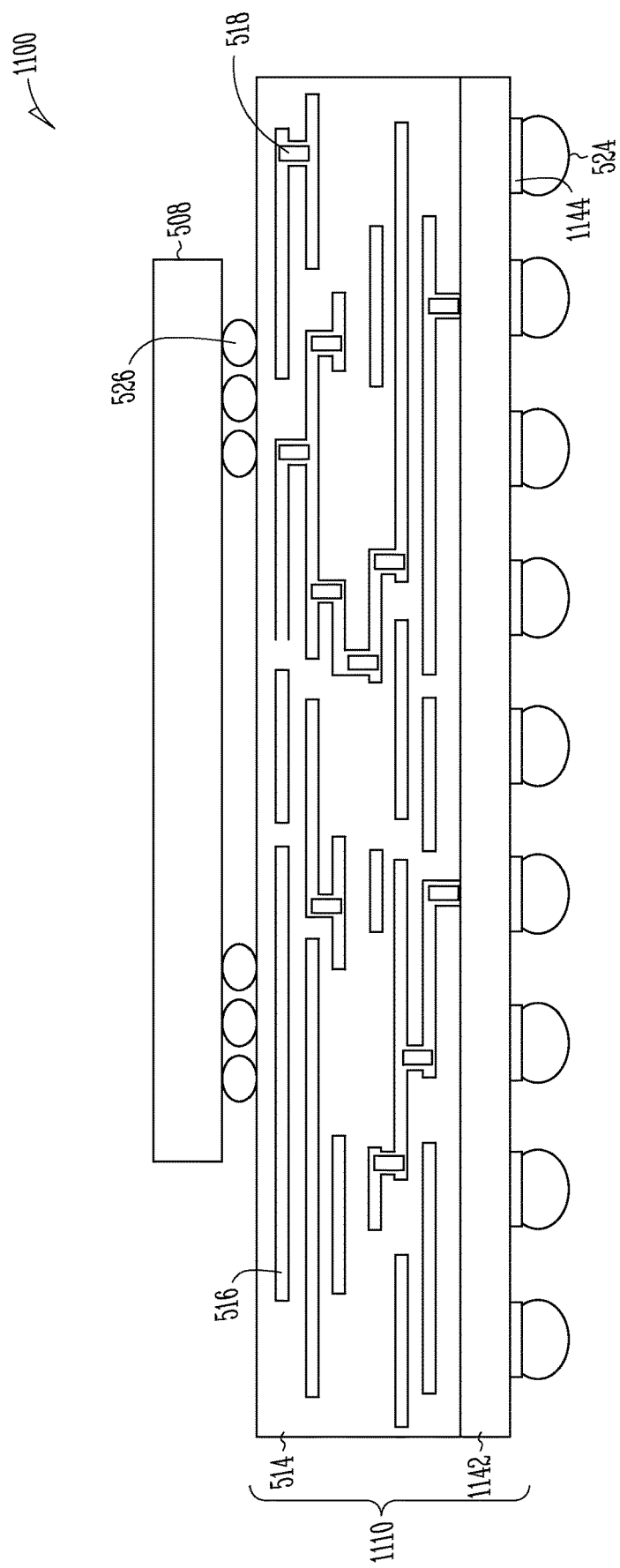
FIG. 11 is an illustration of an example of portions of an electronic device having a substrate that includes a stiffening glass carrier layer in accordance with some embodiments.

FIG. 11 is an illustration of an example of portions of an electronic device with improved robustness with regard to package warping. The electronic device 1100 includes SoC device 508 attached to a substrate 1110. The substrate 1110 includes a stiffening layer that is a glass carrier layer 1142. Because the carrier layer is made of glass, the glass carrier layer 1142 is a warpage compensation layer that reduces the susceptibility of the entire electronic package to warping compared to a substrate made only with an organic material.

The glass carrier layer 1142 may be a composite layer made of multiple layers of glass. The glass carrier layer 1142 may have two glass layers as in the example of FIG. 4. The two glass layers may differ in one or more of thickness, warpage, and CTE. The glass carrier layer 1142 may be a composite glass carrier layer having multiple single glass layers bonded together or multiple double glass layers bonded together.

The substrate 1110 includes an RDL 514 attached to the top surface of the glass carrier layer 1142, and the SoC device 508 is attached to the top surface of the RDL 514. The RDL 514 includes electrically conductive interconnect that includes multiple sublayers of electrically conductive traces 516 and multiple micro vias 518 formed in an organic material. The bottom surface of the glass carrier layer 1142 includes bonding pads 1144 to which solder bumps 524 can be attached. The glass carrier layer 1142 includes TGVs (not shown) to provide electrical continuity between the electrically conductive interconnect of the RDL 514 and the bonding pads 1144. The RDL 514 provides electrical continuity between bonding pads of the SoC device 508 to the TGVs, and the TGVs provide electrical continuity from the RDL 514 to the bonding pads 1144.

There may be a thin interconnect layer (not shown) between the glass carrier layer 1142 and bonding pads 1144 to provide electrical continuity between the TGVs and the bonding pads 1144. In some examples, the glass carrier layer 1142 may include conductive traces to provide electrical continuity between the TGVs and the bonding pads 1144. TGVs may extend from a surface of the glass carrier layer 1142 to conductive traces of the glass carrier layer 1142.

FIGS. 12A-12K illustrate portions of an example of a process flow of forming a substrate having a stiffening glass carrier layer 1142. The process 1200 may be used in forming the substrate 1110 of FIG. 11.

Figure 12A:
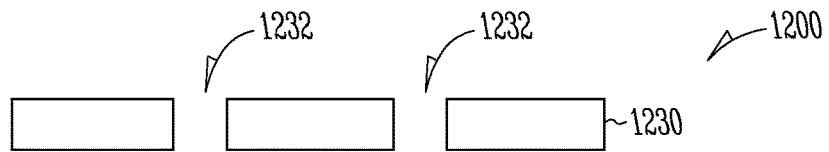
FIGS. 12A-12K illustrate portions of an example of a process flow of forming a substrate having a stiffening glass carrier layer in accordance with some embodiments.
Figure 12B:
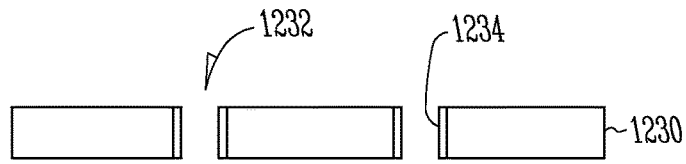

In FIG. 12A, a glass carrier layer 1230 is drilled (e.g., using laser drilling) to form openings 1232 for TGVs. In some examples, the glass carrier layer 1230 is a composite glass layer made of multiple layers of glass of different CTEs to set the warpage of the stiffening glass carrier layer. In FIG. 12B, the openings 1232 are plated with metal 1234.

Figure 12C:
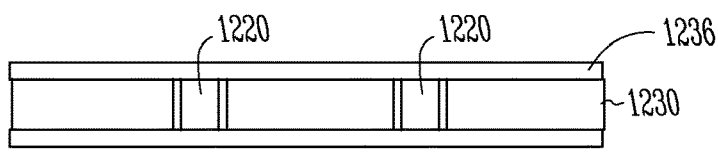

An RDL is formed to contact the top surface of the glass carrier layer 1230. Layers of the RDL are built up using a dielectric and metal. In FIG. 12C, dielectric is formed in the openings 1232 to form TGVs 1220. Dielectric layers are formed on the top and bottom surfaces of the glass carrier layer 1230.

Figure 12D:
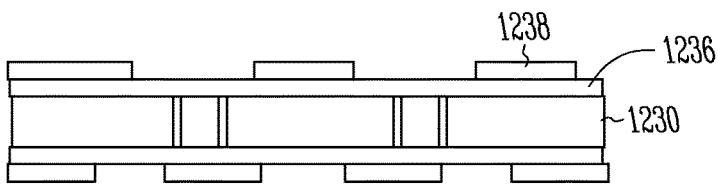
Figure 12E:
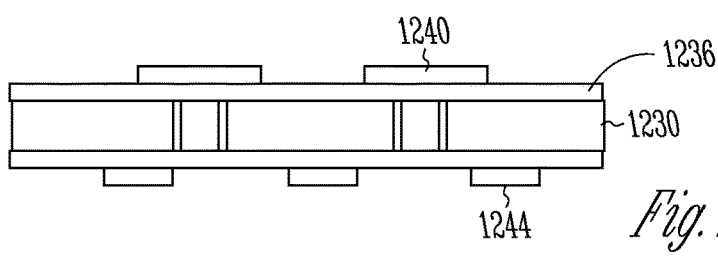
Figure 12F:
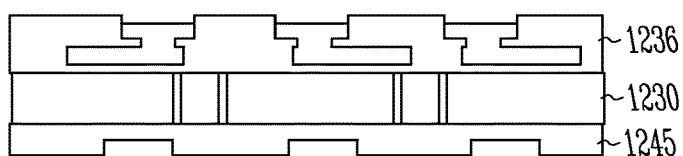

In FIG. 12D, photo resist 1238 is patterned on the dielectric layers using photolithography. A seed layer is deposited on the area exposed by the photo resist. In FIG. 12E, the resist 1238 is removed after metal plating, and seed etching is used to pattern the metal to form conductive traces 1240 and bonding pads 1244. In FIG. 12F, the metal layer including the conductive traces 1240 is filled in with dielectric and additional layers of metal and dielectric are built up on the glass carrier layer 1230. A thin dielectric layer 1245 having conductive traces may be formed between the glass carrier layer 1230 and bonding pads 1244 to provide electrical continuity between the TGVs and the bonding pads 1244.

Figure 12G:
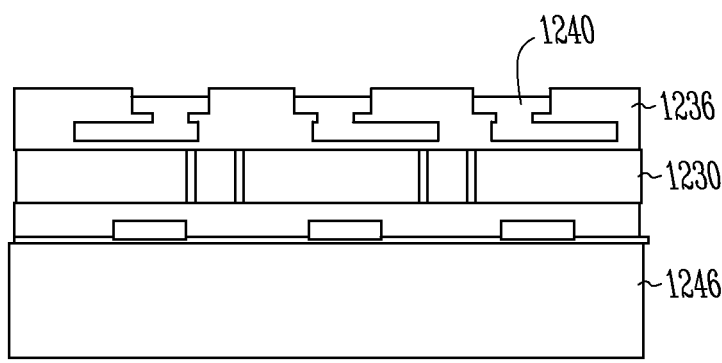
Figure 12H:
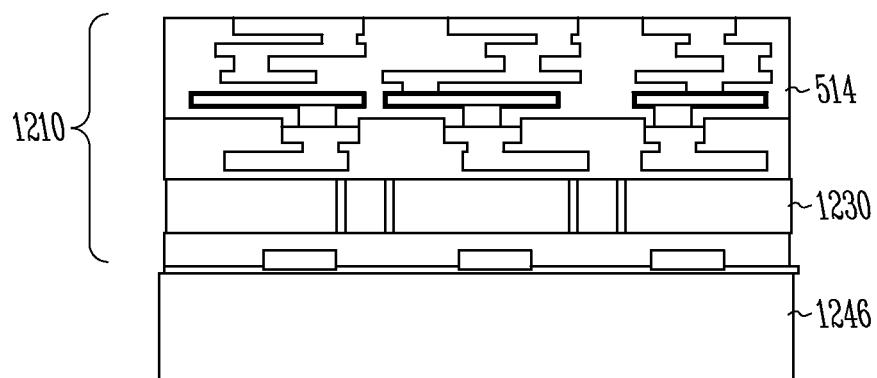
Figure 12I:
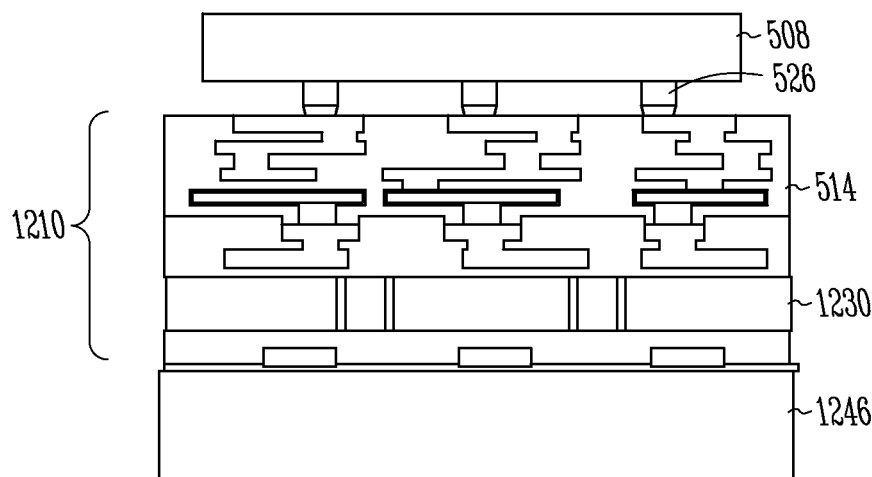
Figure 12J:
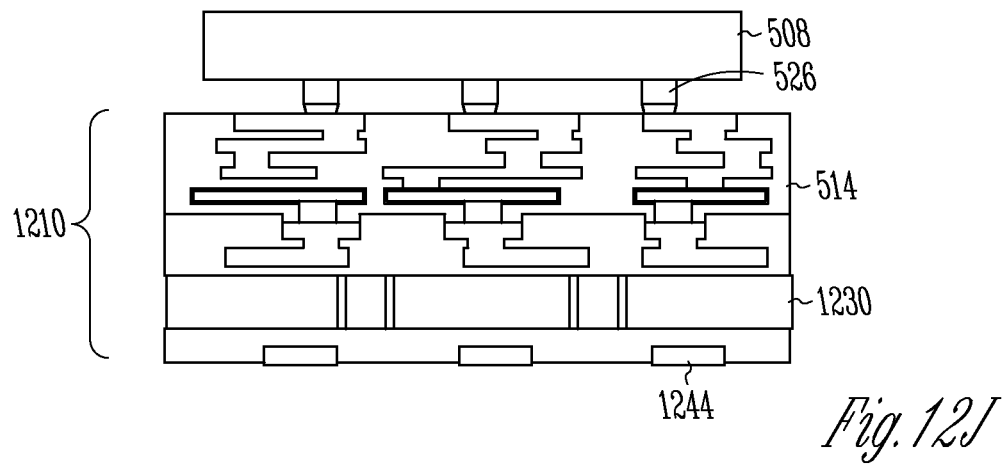
Figure 12K:
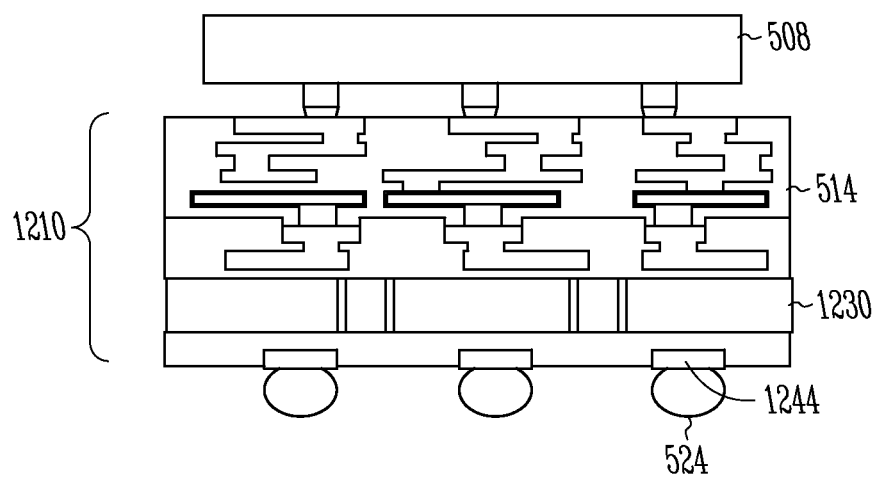

In FIG. 12G, the glass carrier layer 1230 is optionally bonded to a production carrier 1246. The production carrier 1246 is sacrificial and will later be removed. In FIG. 12H, a multi-layer RDL 514 is built-up to form a substrate 1210, thereby forming an electronic device substrate having a stiffening glass carrier layer 1230. In FIG. 12I, a SoC device 508 is attached to the top surface of the substrate 1210. In FIG. 12J, the substrate 1210 is released from the production carrier 1246. In FIG. 12K, solder bumps 524 are added to the bonding pads 1244 exposed by removal of the sacrificial production carrier 1246.

The methods, devices, and systems described herein provide interconnect that can accommodate high frequency signals while providing very dense signal routing. An example of an electronic device using assemblies with system level packaging as described in the present disclosure is included to show an example of a higher level device application.

Figure 13:
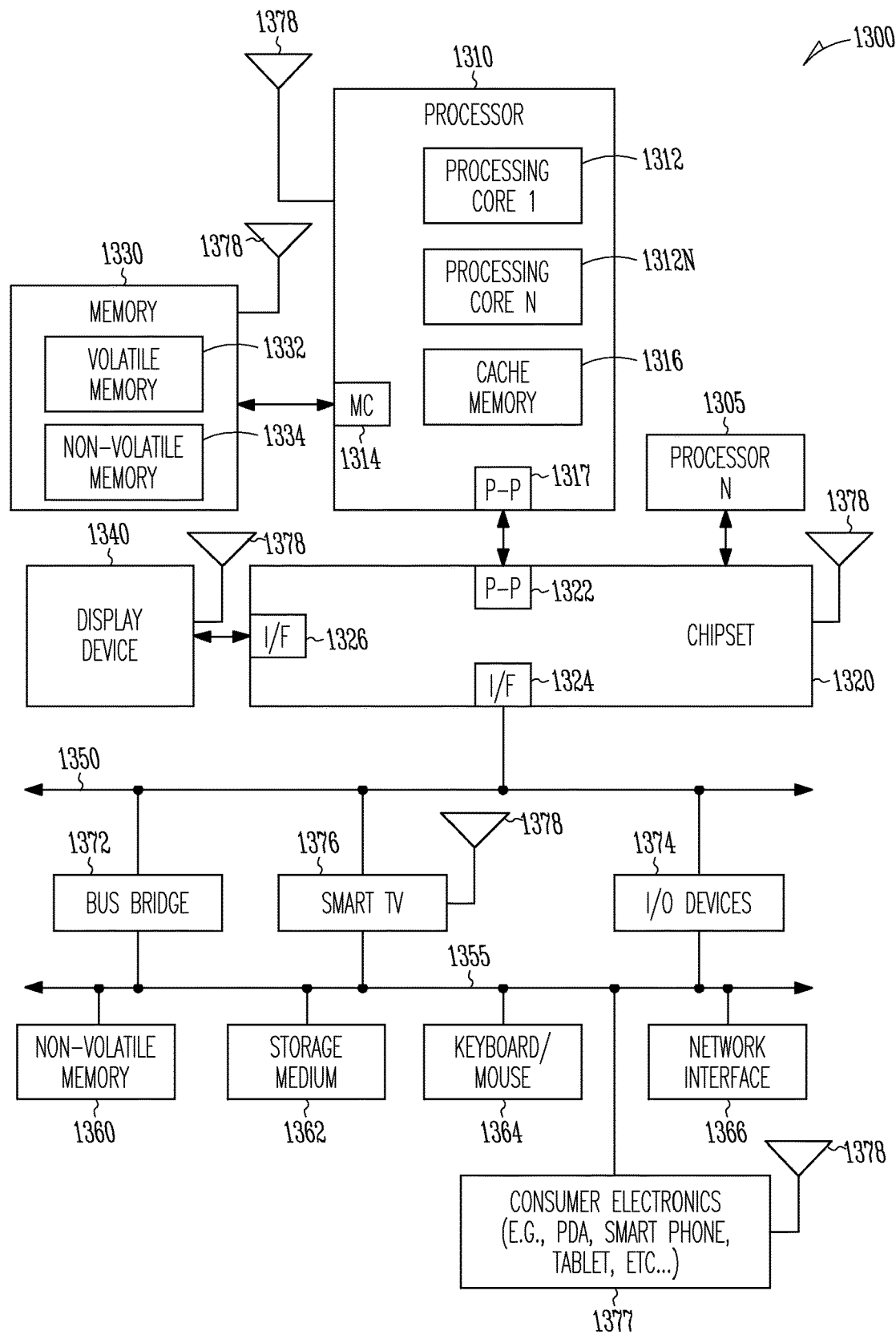
FIG. 13 illustrates a system level diagram in accordance with some embodiments.

FIG. 13 illustrates a system level diagram, according to one embodiment of the invention. For instance, FIG. 13 depicts an example of a system that can include an electronic device packaged with a substrate having a stiffening layer made of ceramic or glass. In one embodiment, system 1300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance, or any other type of computing device. In some embodiments, system 1300 is a system on a chip (SOC) system. In one example, two or more systems as shown in FIG. 13 may be coupled together using one or more glass bridges as described in the present disclosure.

In one embodiment, processor 1310 has one or more processing cores 1312 and 1312N, where N is a positive integer and 1312N represents the Nth processor core inside processor 1310. In one embodiment, system 1300 includes multiple processors including 1310 and 1305, where processor 1305 has logic similar or identical to the logic of processor 1310. In some embodiments, processing core 1312 includes, but is not limited to, pre-fetch logic to fetch instructions, decode logic to decode the instructions, execution logic to execute instructions and the like. In some embodiments, processor 1310 has a cache memory 816 to cache instructions and/or data for system 1300. Cache memory 1316 may be organized into a hierarchal structure including one or more levels of cache memory.

In some embodiments, processor 1310 includes a memory controller 1314, which is operable to perform functions that enable the processor 1310 to access and communicate with memory 1330 that includes a volatile memory 1332 and/or a non-volatile memory 1334. In some embodiments, processor 1310 is coupled with memory 1330 and chipset 1320. Processor 1310 may also be coupled to a wireless antenna 1378 to communicate with any device configured to transmit and/or receive wireless signals. In one embodiment, the wireless antenna interface 1378 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 1332 includes, but is not limited to, Synchronous Dynamic Random Access Memory (SDRAM), Dynamic Random Access Memory (DRAM), RAIVIBUS Dynamic Random Access Memory (RDRAM), and/or any other type of random access memory device. Non-volatile memory 1334 includes, but is not limited to, flash memory, phase change memory (PCM), read-only memory (ROM), electrically erasable programmable read-only memory (EEPROM), or any other type of non-volatile memory device.

Memory 1330 stores information and instructions to be executed by processor 1310. In one embodiment, memory 1330 may also store temporary variables or other intermediate information while processor 1310 is executing instructions. In the illustrated embodiment, chipset 1320 connects with processor 1310 via Point-to-Point (PtP or P-P) interfaces 1317 and 1322. Chipset 1320 enables processor 1310 to connect to other elements in system 1300. In some embodiments of the invention, interfaces 1317 and 1322 operate in accordance with a PtP communication protocol such as the Intel® QuickPath Interconnect (QPI) or the like. In other embodiments, a different interconnect may be used.

In some embodiments, chipset 1320 is operable to communicate with processor 1310, 1305N, display device 1340, and other devices 1372, 1376, 1374, 1360, 1362, 1364, 1366, 1377, etc. Buses 1350 and 1355 may be interconnected together via a bus bridge 1372. Chipset 1320 connects to one or more buses 1350 and 1355 that interconnect various elements 1374, 1360, 1362, 1364, and 1366. Chipset 1320 may also be coupled to a wireless antenna 1378 to communicate with any device configured to transmit and/or receive wireless signals. Chipset 1320 connects to display device 1340 via interface (I/F) 1326. Display 1340 may be, for example, a touchscreen, a liquid crystal display (LCD), a plasma display, cathode ray tube (CRT) display, or any other form of visual display device. In some embodiments of the invention, processor 1310 and chipset 1320 are merged into a single SOC. In one embodiment, chipset 1320 couples with (e.g., via interface 1324) a non-volatile memory 1360, a mass storage medium 1362, a keyboard/mouse 1364, and a network interface 1366 via I/F 824 and/or I/F 1326, I/O devices 1374, smart TV 1376, consumer electronics 1377 (e.g., PDA, Smart Phone, Tablet, etc.).

In one embodiment, mass storage medium 1362 includes, but is not limited to, a solid state drive, a hard disk drive, a universal serial bus flash memory drive, or any other form of computer data storage medium. In one embodiment, network interface 1366 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 13 are depicted as separate blocks within the system 1300, the functions performed by some of these blocks may be integrated within a single semiconductor circuit or may be implemented using two or more separate integrated circuits. For example, although cache memory 1316 is depicted as a separate block within processor 1310, cache memory 1316 (or selected aspects of 1316) can be incorporated into processor core 1312.

The devices, systems, and methods described can provide improved routing of interconnection between ICs for a multichip package by providing a stiffening layer in the packaging to reduce warping, such as when the package is exposed to a temperature during manufacturing. Examples described herein include one SoC for simplicity, but one skilled in the art would recognize upon reading this description that the examples can include more than one SoC system.

Additional Description and Examples

Example 1 includes subject matter (such as an electronic device) comprising a first redistribution layer (RDL) including multiple sublayers of conductive traces formed in an organic material; a stiffening layer including at least one of a ceramic or glass, the stiffening layer including a first surface contacting a first surface of the first RDL and including a through layer via (TLV); and multiple integrated circuit (ICs) arranged on a second surface of the first RDL and including bonding pads, wherein the conductive traces of the first RDL provide electrical continuity between at least one bonding pad of the ICs and at least one TLV of the stiffening layer.

In Example 2, the subject matter of Example 1 optionally includes a second RDL having a first surface contacting the stiffening layer on a second surface of the stiffening layer, wherein the second RDL includes multiple sublayers of conductive traces formed in an organic material; and wherein the stiffening layer is a core layer, and the at least one TLV provides electrical continuity between the conductive traces of the first RDL and the conductive traces of the second RDL.

In Example 3, the subject matter of Example 2 optionally includes a second RDL having a first surface contacting the stiffening layer on a second surface of the stiffening layer, wherein the second RDL includes multiple sublayers of conductive traces formed in an organic material; and wherein the stiffening layer is a core layer, and the at least one TLV provides electrical continuity between the conductive traces of the first RDL and the conductive traces of the second RDL.

In Example 4, the subject matter of Example 3 optionally includes each of the glass layers having a different coefficient of thermal expansion (CTEs).

In Example 5, the subject matter of one or both of Examples 3 and 4 optionally includes the glass core including silicate glass, and the TLV is a plated through hole (PTH) in the glass core having a sidewall plating including at least one of titanium or copper.

In Example 6, the subject matter of one or any combination of Examples 3-5 optionally includes the glass core including at least one conductive trace, and at least one through glass via extending from a surface of the glass core to the through glass via, wherein the at least one through glass via provides electrical continuity between at least one conductive trace of the first RDL and the conductive trace of the glass core.

In Example 7, the subject matter of one or any combination of Examples 2-6 optionally includes another stiffening layer including one of ceramic or glass and at least one TLV formed in the ceramic or glass; wherein a first surface of the other stiffening layer contacts a second surface of the second RDL, and the conductive traces of the second RDL providing electrical continuity between the at least one TLV of the stiffening layer and the at least one TLV of the other stiffening layer.

In example 8, the subject matter of one or any combination of Examples 1-7 optionally includes the stiffening layer being a carrier layer including at least one bonding pad on a second surface of the carrier layer, and the at least one TLV provides electrical continuity between the conductive traces of the first RDL and the at least one bonding pad.

In Example 9, the subject matter of Example 8 optionally includes the carrier layer being a glass carrier layer including multiple glass layers bonded together.

In Example 10, the subject matter of Example 9 optionally includes at least two glass layers of the multiple glass layers of the glass carrier layer having different coefficients of thermal expansion (CTEs).

In Example 11, the subject matter of one or both of Examples 9 and 10 optionally includes a glass carrier layer including at least one conductive trace, and at least one through glass via extending from a surface of the glass carrier layer to the at least one conductive trace.

In Example 12, the subject matter of Example 1 optionally includes the stiffening layer being a multi-layer stack including at least one glass layer and at least one ceramic layer.

In Example 13, the subject matter of one or any combination of Examples 1-12 optionally includes the multiple ICs including multiple chiplets.

Example 14 includes subject matter (such as a method of forming an electronic device) or can optionally be combined with one or any combination of Examples 1-13 to include such subject matter, comprising forming a stiffening layer including one of a ceramic or glass; forming at least one through layer via (TLV) in the stiffening layer, wherein the TLV extends from a first surface of the stiffening layer to a second surface opposite the first surface; forming a first redistribution layer (RDL) to contact the first surface of the stiffening layer, wherein an RDL includes organic material and multiple sublayers of conductive traces formed in the organic material; bonding a first surface of the RDL to a first surface of the stiffening layer; disposing multiple integrated circuit (ICs) on a second surface of the first RDL, wherein at least one conductive trace of the RDL provides electrical continuity between a bonding pad of an IC of the multiple ICs and the at least one TLV of the stiffening layer.

In Example 15, the subject matter of Example 14 optionally includes bonding a second RDL to a second surface of the stiffening layer such that the at least one TLV provides electrical continuity between the conductive traces of the first RDL and the conductive traces of the second RDL.

In Example 16, the subject matter of one or both of Examples 14 and 15 optionally includes bonding a first glass layer to a second glass layer to form a glass core.

In Example 17, the subject matter of Example 16 optionally includes the first and second glass layers each having a different coefficient of thermal expansion (CTE) and the method further includes bonding the first and second glass layers are bonded together at a surface common to the first and second glass layers.

In Example 18, the subject matter of one or any combination of Examples 14-17 optionally includes forming bonding pads on a second surface of the stiffening layer, such that the at least one TLV provides electrical continuity between at least one conductive trace of the first RDL and at least one bonding pad of the bonding pads on the second surface of the stiffening layer.

In Example 19, the subject matter of Example 18 optionally includes bonding multiple glass layers together to form a glass carrier layer as the stiffening layer.

In Example 20, the subject matter of Example 19 optionally includes at least two glass layers of the multiple glass layers of the glass carrier layer have different coefficients of thermal expansion (CTEs).

Example 21 includes subject matter (such as packaged electronic system) or can optionally be combined with one or any combination of Example 1-20 to include such subject matter, comprising a first redistribution layer (RDL) including multiple sublayers of conductive traces formed in an organic material, a stiffening layer including one of a ceramic or glass, the stiffening layer including a first surface contacting a first surface of the first RDL and including a through layer via (TLV), multiple chiplets disposed on a second surface of the first RDL and including bonding pads, wherein the conductive traces of the first RDL provide electrical continuity between at least one bonding pad of the ICs and at least one TLV of the stiffening layer, and an antenna operatively coupled to at least one of the chiplets.

In Example 22, the subject matter of Example 21 optionally includes stiffening layer being a glass core. The system optionally includes a second RDL formed using the organic material and including multiple sublayers of conductive traces, wherein a first surface of the second RDL contacts the glass core on a second surface of the glass core, and wherein the at least one TLV provides electrical continuity between the conductive traces of the first RDL and the conductive traces of the second RDL.

In Example 23, the subject matter of Example 22 optionally includes the glass core including two glass layers bonded together at a surface common to the two glass layers, and each of the glass layers having a different coefficient of thermal expansion (CTEs).

In Example 24, the subject matter of one or any combination of Examples 21-23 optionally includes the stiffening layer being a glass carrier layer including at least one bonding pad on a second surface of the glass carrier layer, and wherein the at least one TLV provides electrical continuity between the conductive traces of the first RDL and the at least one bonding pad.

In Example 25, the subject matter of Example 24 optionally includes the glass carrier layer including multiple glass layers bonded together; and wherein at least two glass layers of the multiple glass layers of the glass carrier layer have different coefficients of thermal expansion (CTEs).

These non-limiting examples can be combined in any permutation or combination. The Abstract is provided to allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:
1. An electronic device, comprising:
a redistribution layer (RDL) comprising one or more sublayers of conductive traces in an organic material;

a stiffening layer comprising a first surface contacting a first surface of the RDL and comprising a through layer via (TLV), wherein the stiffening layer is a multi-layer stack comprising at least one glass layer and at least one ceramic layer; and multiple integrated circuits (ICs) on a second surface of the RDL, wherein the conductive traces of the RDL provide electrical continuity between at least one of the multiple ICs and the TLV of the stiffening layer.

2. The electronic device of claim 1, further comprising: a second RDL having a first surface contacting a second surface of the stiffening layer, wherein the TLV provides electrical continuity between the RDL and the second RDL.

3. The electronic device of claim 2, further comprising: a second stiffening layer comprising one of a ceramic or glass and a second TLV in the ceramic or glass of the second stiffening layer, wherein a first surface of the second stiffening layer contacts a second surface of the second RDL.

4. The electronic device of claim 1, wherein the stiffening layer is a carrier layer comprising at least one bonding pad on a second surface thereof.

5. The electronic device of claim 1, wherein the TLV is a plated through hole (PTH) comprising a sidewall layer comprising at least one of titanium or copper.

6. The electronic device of claim 1, wherein the multiple ICs comprise multiple chiplets.

7. The electronic device of claim 1, further comprising an antenna coupled to at least one of the multiple ICs.

8. An electronic device, comprising:
a first redistribution layer (RDL) comprising one or more first sublayers of first conductive traces in a first organic material;
a first stiffening layer comprising at least one of a ceramic or glass, the first stiffening layer comprising a first surface contacting a first surface of the first RDL and comprising a first through layer via (TLV);
multiple integrated circuits (ICs) on a second surface of the first RDL, wherein the first conductive traces provide electrical continuity between at least one of the multiple ICs and the first TLV;
a second RDL having a first surface contacting a second surface of the first stiffening layer, the second RDL comprising one or more second sublayers of second conductive traces formed in a second organic material, wherein the first TLV provides electrical continuity between the first conductive traces and the second conductive traces; and
a second stiffening layer comprising one of a ceramic or glass and a second TLV in the ceramic or glass of the second stiffening layer, wherein a first surface of the second stiffening layer contacts a second surface of the second RDL.

9. The electronic device of claim 8, wherein the first stiffening layer and/or the second stiffening layer comprises two glass layers bonded together at a surface common to the two glass layers.

10. The electronic device of claim 9, wherein each of the two glass layers has a different coefficient of thermal expansion (CTEs).

11. The electronic device of claim 9, wherein at least one of the two glass layers comprises silicate glass.

12. The electronic device of claim 9, wherein the first stiffening layer and/or the second stiffening layer comprising the two glass layers further comprises a third conductive trace.

13. The electronic device of claim 12, further comprising a through glass via (TGV) extending to the third conductive trace, wherein the TGV provides electrical continuity to the third conductive trace.

14. The electronic device of claim 8, wherein the first TLV and/or the second TLV comprises a plated through hole (PTH) comprising a sidewall layer comprising at least one of titanium or copper.

15. The electronic device of claim 8, wherein the second stiffening layer is a carrier layer comprising at least one bonding pad on a second surface thereof.

16. The electronic device of claim 8, wherein the multiple ICs comprise multiple chiplets.

17. The electronic device of claim 8, further comprising an antenna coupled to at least one of the multiple ICs.

18. An electronic device comprising:
a redistribution layer (RDL) comprising one or more sublayers of conductive traces in an organic material;
a stiffening layer comprising two glass layers bonded together, wherein the stiffening layer comprises a conductive trace and a through glass via (TGV) extending from a first surface or a second surface of the stiffening layer to the conductive trace, wherein the first surface of the stiffening layer contacts a first surface of the RDL, and wherein the stiffening layer comprises a through layer via (TLV); and
multiple integrated circuits (ICs) on a second surface of the first RDL, wherein the conductive traces of the first RDL provide electrical continuity between at least one of the multiple ICs and the TLV of the stiffening layer.

19. The electronic device of claim 18, further comprising:
a second RDL having a first surface contacting a second surface of the stiffening layer, wherein the TLV provides electrical continuity between the RDL and the second RDL.

20. The electronic device of claim 19, further comprising:
a second stiffening layer comprising one of a ceramic or glass and a TLV in the ceramic or glass of the second stiffening layer, wherein a first surface of the second stiffening layer contacts a second surface of the second RDL.

21. The electronic device of claim 18, wherein the stiffening layer is a carrier layer comprising at least one bonding pad on a second surface thereof.

22. The electronic device of claim 18, wherein each of the two glass layers has a different coefficient of thermal expansion (CTEs).

23. The electronic device of claim 18, wherein at least one of the two glass layers comprises silicate glass.

24. The electronic device of claim 18, wherein the multiple ICs comprise multiple chiplets.

25. The electronic device of claim 18, further comprising an antenna coupled to at least one of the multiple ICs.

* * * * *